(12) United States Patent
Matsuda et al.

(10) Patent No.: US 6,648,976 B1
(45) Date of Patent: Nov. 18, 2003

(54) APPARATUS AND METHOD FOR PLASMA PROCESSING

(75) Inventors: Izuru Matsuda, Kadoma (JP); Hideo Haraguchi, Toyonaka (JP); Takuya Matsui, Matsubara (JP); Shigeyuki Yamamoto, Nara (JP)

(73) Assignee: Matsushita Electric Industrial Co., Ltd., Osaka-fu (JP)

( * ) Notice: Subject to any disclaimer, the term of this patent is extended or adjusted under 35 U.S.C. 154(b) by 0 days.

(21) Appl. No.: 09/511,787

(22) Filed: Feb. 23, 2000

(30) Foreign Application Priority Data

Feb. 24, 1999 (JP) .............................. 11-046246

(51) Int. Cl.⁷ ......................... C23C 16/00; H05H 1/00
(52) U.S. Cl. .................. 118/728; 118/725; 156/345.51
(58) Field of Search ............... 118/728, 725, 118/723 R, 723 E; 156/345.51, 345.52, 345.53

(56) References Cited

U.S. PATENT DOCUMENTS 5,531,835 A * 7/1996 Fodor et al. ............... 118/728
5,542,559 A * 8/1996 Kawakami et al. .......... 216/67
5,792,304 A * 8/1998 Tamura et al. .............. 156/345
6,033,482 A * 3/2000 Parkhe ....................... 118/728

FOREIGN PATENT DOCUMENTS

| JP | 63-72877 | 4/1988 |
|---|---|---|
| JP | 2-7520 | 1/1990 |
| JP | 3-102820 | 4/1991 |
| JP | 4-100257 | 4/1992 |
| JP | 10-189544 | 7/1998 |

* cited by examiner

Primary Examiner—Parviz Hassanzadeh
(74) Attorney, Agent, or Firm—Wenderoth, Lind & Ponack, L.L.P.

(57) ABSTRACT

A plasma processing apparatus includes a vacuum chamber for evacuating gas therefrom, for introducing reaction gas therein, and for generating plasma therein through high frequency power application. A substrate hold stage is set in the vacuum chamber, with the substrate hold stage including a set face having a recessed part, wherein a rear face of a substrate to be subjected to plasma processing is held on the set face.

10 Claims, 4 Drawing Sheets

APPARATUS AND METHOD FOR PLASMA PROCESSING

BACKGROUND OF THE INVENTION

The present invention relates to a plasma processing apparatus used in a thin film formation process or in a fine processing step, etc. for producing semniconductor elements, liquid crystal display panels, solar batteries and the like.

Increasing efforts have been put forth for a plasma processing apparatus of the type referred to above so as to realize high-accuracy, high-speed, large-area, and low-damage to devices with an aim to endow the devices with a high level of function and reduce costs associated therewith. Particularly, in an attempt to obtain a film quality uniformity for a substrate in a film forming process or in an attempt to secure a size accuracy in a dry etching process employed in fine processing, precise and uniform control of a temperature of the substrate within its plane is strongly required. Therefore, a plasma processing apparatus of a model using a mechanical clamp or an electrostatic attraction electrode as structure for controlling the substrate temperature has been used for the above purpose.

A conventional plasma processing apparatus using an electrostatic attraction electrode will be described below.

By way of example of the prior art, those plasma processing apparatuses are disclosed in Japanese Laid-Open Patent Publications Nos. 63-7287, 2-7520, 3-102820, 10-189544, and 4-100257.

FIG. 5 is a sectional view of a reaction chamber of the plasma processing apparatus disclosed in Japanese Laid-Open Patent Publication No. 4-100257. This plasma processing apparatus will be discussed hereinbelow as a first example of the prior art.

In FIG. 5, a vacuum chamber 131 includes a gas introduction opening 140 connected to an etching gas introduction device 139 and, a vacuum discharge device 141. An electrostatic attraction electrode 133 is set in the vacuum chamber 131 for electrostatically attracting a substrate 132 to be processed. The electrostatic attraction electrode 133 has an insulating layer 133F (shown in FIG. 6) at a front face and a pair of half-round internal electrodes 142 thereinside as shown in FIG. 8. To the electrostatic attraction electrode 133 are connected a d.c. power source 134 for the electrostatic attraction of the substrate 132 to be processed, and a high frequency power feed device 136. The d.c. power source 134 has a switch mechanism 135 for inverting polarities. A quartz glass plate 138 is placed in the vacuum chamber 131 to confront the electrostatic attraction electrode 133, and an ultraviolet ray source 137 is arranged outside of the vacuum chamber 131 to face the quartz glass plate 138. A push mechanism 143 is also provided for moving up and down the substrate 132 to be processed, and to set and separate the substrate to and from the electrostatic attraction electrode 133.

The operation of the thus-constituted conventional plasma processing apparatus 130 will be depicted below.

The substrate 132 is secured to the front face of the electrostatic attraction electrode 133, so that the substrate is brought to a temperature optimum for plasma processing, when positive and negative voltages are applied by the d.c. power source 134, respectively, to the pair of the internal electrodes 142. In this state, a normal plasma process is carried out on the substrate 132.

After completion of the plasma process, residual electric charges remain at the insulating layer at the front face of the electrostatic attraction electrode 133 although the d.c. power source 134 is shut off. As a result, the substrate 132 remains attracted to the electrostatic attraction electrode 133. In order to stably separate the substrate 132 from the electrostatic attraction electrode 133 by the push mechanism 143 without breaking the substrate or causing similar trouble, in this case d.c. voltages with inverted polarities are applied via the switch mechanism 135 to the internal electrodes, thereby negating the residual electric charges at the substrate 132. Thereafter, the substrate 132 is separated from the electrostatic attraction electrode by the push mechanism 143. Then, ultraviolet rays from the ultraviolet ray source 137, e.g. a mercury lamp, are irradiated to a surface of the insulating layer via the quartz glass plate 138, thereby extinguishing the residual electric charges at the surface of the insulating layer. As is described in the publication, however, the residual electric charges cannot be completely removed by the simple application of d.c. voltages of inverted polarities to the internal electrodes. Moreover, if the d.c. voltages are applied for too long a time, the substrate 132 might be conversely attracted to the electrostatic attraction electrode 133 in some cases, thereby hindering the separation resulting from the push mechanism 143 and probably resulting in a problem when the substrate 132 is to be transferred to a next process. Further, the residual attraction resulting from the residual charges varies depending upon a process pressure, a kind of gas, a gas flow rate, a gas flow ratio and the other parameters as plasma process conditions, or by differences of individual substrates.

The electrostatic attraction electrode 133 is not free from dust, which will be depicted with reference to FIG. 6. Reference numeral 133A is a contact part at a face of the electrostatic attraction electrode continuous with an outer peripheral edge part of the substrate 132. Reference numeral 133B is an end part of the contact face of the electrostatic attraction electrode 133 extending perpendicular to the substrate 132, and reference numeral 133D is a part of the electrostatic attraction electrode 133 that is recessed and not to be in contact with the substrate 132. A shape of the recessed part determines a contact area between the electrostatic attraction electrode 133 and the substrate 132 to enable control of a substrate temperature to achieve optimum plasma processing, although the generation and swirl of dust is not taken into account. The substrate itself contains a degree of warp from a point in time when the substrate 132 is sent into the plasma processing apparatus 130. When the predetermined d.c. voltages are suddenly applied to attract the substrate 132, the attraction proceeds in a manner such that the surface of the electrostatic attraction electrode 133 rubs against a warped portion of the substrate, whereby a rear-face of the substrate 132 or the electrostatic attraction electrode 133 is rubbed. Also, since a frictional resistance, when the end part 133B attracts the substrate 132, increases, the rear face of the substrate 132 or electrostatic attraction electrode 133 is rubbed even more. The rubbed portion of the substrate 132 or electrode 133 becomes a dust source, resulting in a decreased yield. The phenomenon is much more noticeable as the substrate is larger in size. Because of the above reasons, the conventional plasma processing apparatus 130 has a problem to be solved with regard to reliability.

The present invention is devised to solve the aforementioned problem and has for its object to provide an apparatus and a method whereby an attraction force generated by residual electric charges between a substrate and a substrate hold stage is reduced so that the substrate and the substrate hold stage can be separated from each other without any problems, irrespective of process conditions, differences of individual substrates, etc., and at the same time the generation and swirl of dust resulting from rubbing of the substrate and the substrate hold stage subsequent to the attraction is prevented.

SUMMARY OF THE INVENTION

In accomplishing these and other objects, according to a first aspect of the present invention, there is provided a plasma processing apparatus comprising:

a vacuum chamber for evacuating gas therefrom, for introducing reaction gas therein, and for generating plasma therein through high frequency power application; and a substrate hold stage set in the vacuum chamber, with the substrate hold stage including a set face having a recessed part, and wherein a rear face of a substrate to be subjected to plasma processing is held on the set face.

According to a second aspect of the present invention, there is provided a plasma processing apparatus as defined in accordance with the first aspect, wherein the set face has an area that is to contact the substrate which is not smaller than 5% and not larger than 15% of a plane area of the substrate.

According to a third aspect of the present invention, there is provided a plasma processing apparatus comprising:

a vacuum chamber for evacuating gas therefrom, for introducing reaction gas therein, and for generating plasma therein through high frequency power application; and a substrate hold stage set in the vacuum chamber, with the substrate hold stage including a set face, wherein a rear face of a substrate to be subjected to plasma processing is held on the set face, wherein the set face is formed to follow an outer circumferential edge part of the substrate, and wherein the set face is formed of two or more band-like parts or radially-spaced circumferential portions that have an area that is to contact the substrate which is not larger than 10% of a planar area of the substrate.

According to a fourth aspect of the present invention, there is provided a plasma processing apparatus comprising:

a vacuum chamber for evacuating gas therefrom, for introducing reaction gas therein, and for generating plasma therein through high frequency power application; and a substrate hold stage set in the vacuum chamber, with the substrate hold stage including a set face, wherein a rear face of a substrate to be subjected to plasma processing is held on the set face, and wherein the set face is provided with recessed parts of a plurality of depths such that 80% or more of a total area of the recessed parts have a depth smaller than 100 $\mu$m and 5–20% of the total area of the recessed parts have a depth of not smaller than 100 $\mu$m.

According to a fifth aspect of the present invention, there is provided a plasma processing apparatus comprising:

a vacuum chamber for evacuating gas therefrom, for introducing reaction gas therein, and for generating plasma therein through high frequency power application; and a substrate hold stage set in the vacuum chamber, with the substrate hold stage including a set face, wherein a rear face of a substrate to be subjected to plasma processing held on the set face, and wherein the set face is provided with a recessed part which forms edge part that touches the substrate along a smooth curve.

According to a sixth aspect of the present invention, there is provided a plasma processing apparatus comprising:

a vacuum chamber for evacuating gas therefrom, for introducing reaction gas therein, and for generating plasma therein through high frequency power application; and a substrate hold stage set in the vacuum chamber, with the substrate hold stage including a set face wherein, a rear face of a substrate to be subjected to plasma processing is held on the set face and wherein, an edge part of the substrate hold stage in contact with the substrate is shaped as a semi-circular smooth curve having of a radius of curvature of not smaller than 5 $\mu$m.

According to a seventh aspect of the present invention, there is provided a plasma processing apparatus as defined in accordance with the first aspect, wherein the substrate hold stage includes an electrostatic attraction electrode to which positive and negative d.c. voltages are applied by positive and negative d.c. voltage application parts, and wherein a rear face of a substrate to be subjected to plasma processing is held on the set face by applying the positive and negative d.c. voltages to the electrostatic attraction electrode to generate charges by which the substrate and the substrate hold stage are attracted to each other.

According to an eighth aspect of the present invention, there is provided a plasma processing apparatus as defined in accordance with the second aspect, wherein the substrate hold stage includes an electrostatic attraction electrode to which positive and negative d.c. voltages are applied by positive and negative d.c. voltage application parts, and wherein a rear face of a substrate to be subjected to plasma processing is held on the set face by applying the positive and negative d.c. voltages to the electrostatic attraction electrode to generate charges by which the substrate and the substrate hold stage are attracted to each other.

According to a ninth aspect of the present invention, there is provided a plasma processing apparatus as defined in accordance with the third aspect, wherein the substrate hold stage includes an electrostatic attraction electrode to which positive and negative d.c. voltages are applied by positive and negative d.c. voltage application parts, and wherein a rear face of a substrate to be subjected to plasma processing is held on the set face by applying the positive and negative d.c. voltages to the electrostatic attraction electrode to generate charges by which the substrate and the substrate hold stage are attracted to each other.

According to a tenth aspect of the present invention, there is provided a plasma processing apparatus as defined in accordance with the fourth aspect, wherein the substrate hold stage includes an electrostatic attraction electrode to which positive and negative d.c. voltages are applied by positive and negative d.c. voltage application parts, and wherein a rear face of a substrate to be subjected to plasma processing is held on the set face by applying the positive and negative d.c. voltages to the electrostatic attraction electrode to generate charges by which the substrate and the substrate hold stage are attracted to each other.

According to an eleventh aspect of the present invention, there is provided a plasma processing apparatus as defined in accordance with the fifth aspect, wherein the substrate hold stage includes an electrostatic attraction electrode to which positive and negative d.c. voltages are applied by positive and negative d.c. voltage application parts, and wherein a rear face of a substrate to be subjected to plasma processing is held on the set face by applying the positive and negative d.c. voltages to the electrostatic attraction electrode to generate charges by which the substrate and the substrate hold stage are attracted to each other.

According to a twelfth aspect of the present invention, there is provided a plasma processing apparatus as defined in accordance with the sixth aspect, wherein the substrate hold stage includes an electrostatic attraction electrode to which positive and negative d.c. voltages are applied by positive and negative d.c. voltage application parts, and wherein a rear face of a substrate to be subjected to plasma processing is held on the set face by applying the positive and negative d.c. voltages to the electrostatic attraction electrode to generate charges by which the substrate and the substrate hold stage are attracted to each other.

According to a thirteenth aspect of the present invention, there is provided a plasma processing method comprising:

holding a substrate to be subjected to plasma processing with a rear face of the substrate being held on a set face of a substrate hold stage set in a vacuum chamber;

evacuating gas from the vacuum chamber, introducing reaction gas into the vacuum chamber, and generating plasma in the vacuum chamber through high frequency power application to perform plasma processing of the substrate; and removing the processed substrate from the set face after completion the plasma processing, wherein in the holding of the substrate, a d.c. voltage is applied to electrodes in the substrate hold stage while the d.c. voltage is gradually increased to a predetermined value to hold the substrate on the substrate hold stage, and in the removing of the processed substrate, the d.c. voltage is gradually decreased from the predetermined value to remove the processed substrate from the substrate hold stage.

According to a fourteenth aspect of the present invention, there is provided a method for plasma processing according to the thirteenth aspect, wherein in applying the d.c. voltage, the application of the d.c. voltage is carried out at an absolute value of 100V/sec or lower before reaching not larger than 20% of a maximum application value, and is then carried out at a value higher than the absolute value of 100V/sec, whereas in removing the substrate, the d.c. voltage is decreased at a value higher than the absolute value of 100V/sec before reaching not larger than 20% of the maximum application value, and is then carried out at the absolute value 100V/sec or lower to stop the application of the d.c. voltage for removing the substrate.

According to a fifteenth aspect of the present invention, there is provided a plasma processing apparatus comprising:

a vacuum chamber for evacuating gas therefrom, for introducing reaction gas therein, and for generating plasma therein through high frequency power application; and a substrate hold stage set in the vacuum chamber, with the substrate hold stage including an electrostatic attraction electrode to which positive and negative d.c. voltages are applied by positive and negative d.c. voltage application parts, wherein a rear face of a substrate to be subjected to plasma processing is held on the set face by applying the positive and negative d.c. voltages to the electrostatic attraction electrode to generate charges by which the substrate and the substrate hold stage are attracted to each other, wherein the positive d.c. voltage application part by which the positive d.c. voltage is to be applied is divided into two or more sections, and wherein the negative d.c. voltage application part by which the negative d.c. voltage is to be applied is divided into two or more sections, with the positive voltage sections and the negative d.c. voltage sections to be respectively controlled individually.

According to a sixteenth aspect of the present invention, there is provided a plasma processing apparatus as defined in accordance with the fifteenth aspect, wherein a first of the sections of the positive d.c. voltage and a first of the sections of the negative d.c. voltage charges a vicinity of a center of the substrate, and the remaining second section of the positive d.c. voltage and second section of the negative d.c. voltage charges an outer circumferential portion of the substrate.

According to a seventeenth aspect of the present invention, there is provided a plasma processing method comprising:

holding a substrate to be subjected to plasma processing with a rear face of the substrate being held on a set face of a substrate hold stage set in a vacuum chamber;

evacuating gas from the vacuum chamber, introducing reaction gas into the vacuum chamber, and generating plasma in the vacuum chamber through high frequency power application to perform plasma processing of the substrate; and removing the processed substrate from the set face after completion of the plasma processing, wherein in holding the substrate on the substrate hold stage, a d.c. voltage is applied to an electrostatic attraction electrode of the substrate hold stage, thereby charging the substrate in a manner so that the charging is first carried out at a vicinity of a center of the substrate and then spreads towards an outer circumference thereof concentrically with the vicinity of the center, while in removing the substrate from the substrate hold stage, electrification caused by the charging is eliminated by stopping the application of the d.c. voltage to the outer circumferential portion of the substrate and finally stopping the application of the d.c. voltage to the central part of the substrate.

According to an eighteenth aspect of the present invention, there is provided a plasma processing apparatus in accordance with the first aspect, wherein the apparatus is a dry etching apparatus for performing dry etching of the substrate in the vacuum chamber.

According to a nineteenth aspect of the present invention, there is provided a plasma processing method in accordance with the thirteenth aspect, wherein the method is a dry etching method for performing dry etching of the substrate in the vacuum chamber.

According to the present invention, the residual attraction to the substrate to be processed is eliminated and problems in transferring the substrate to be processed are solved, so that the apparatus is enhanced with regard to reliability while exhibiting capability of controlling a temperature of the substrate for optimum plasma processing. Product failures due to the generation and swirl of dust are also avoided. Each apparatus and method in accordance with the above aspects can individually achieve the above effect sufficiently.

BRIEF DESCRIPTION OF THE DRAWINGS

These and other aspects and features of the present invention will become clear from the following description taken in conjunction with the preferred embodiments thereof with reference to the accompanying drawings, in which.

DETAILED DESCRIPTION OF THE PREFERRED EMBODIMENTS

Figure 1:
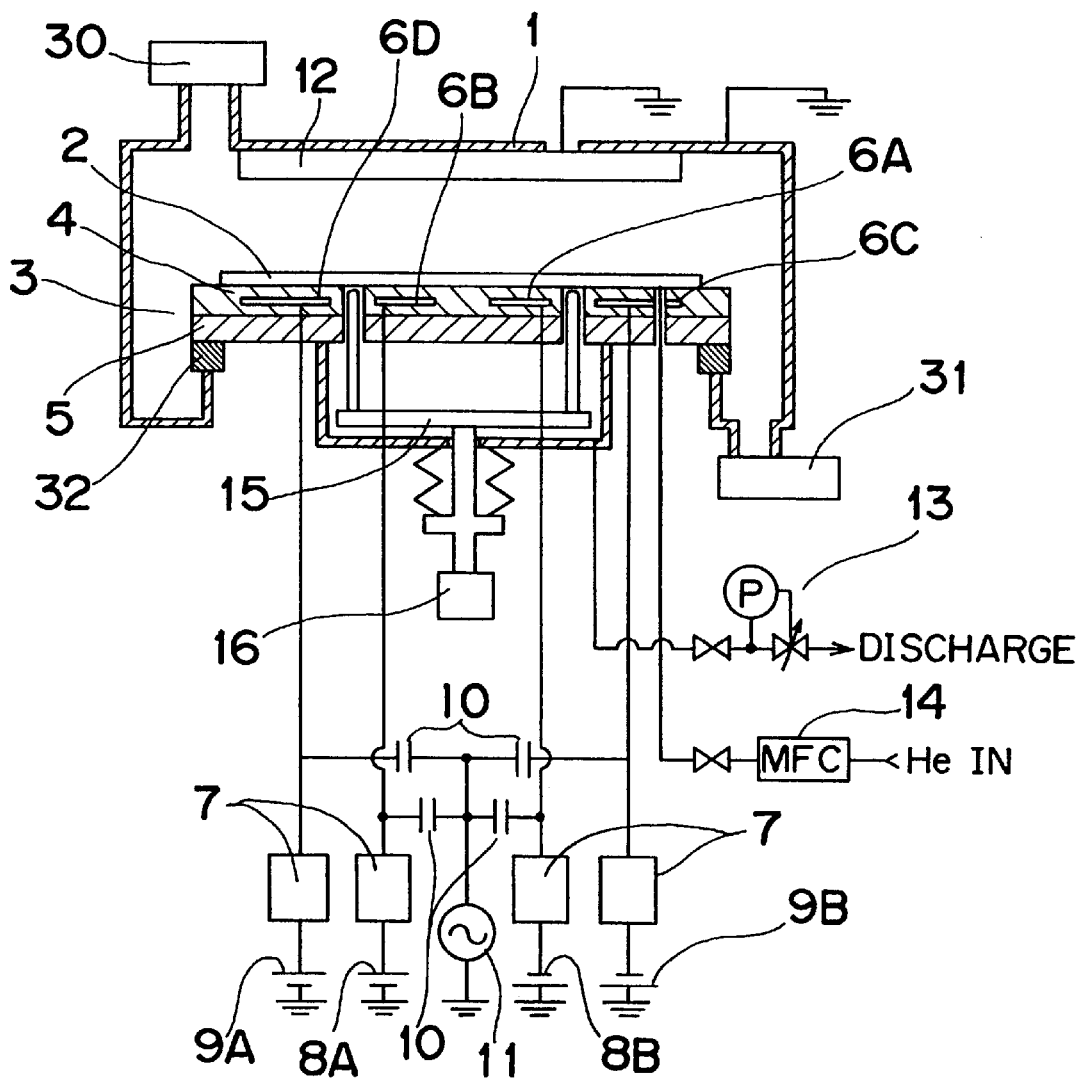
FIG. 1 is a sectional view of a reaction chamber of a plasma processing apparatus according to a preferred embodiment of the present invention.

Before the description of the present invention proceeds, it is to be noted that like parts are designated by like reference numerals throughout the accompanying drawings.

An apparatus and a method according to a preferred embodiment of the present invention will be described hereinbelow with reference to FIG. 1.

A reactive ion etching type dry etching apparatus will be described as the embodiment of the present invention with reference to the drawings.

Embodiment 1

In FIG. 1, reference numeral 1 denotes a vacuum chamber having a vacuum discharge device and a reaction gas feed device; reference numeral 2 denotes an Si wafer which is an example of a substrate to be processed; and reference numeral 3 denotes a substrate hold stage of an electrostatic attraction type constructed from an alumina dielectric body 4 having a thickness of 5 mm and an aluminum base part 5 including a cooling water passage (not shown) thereinside. Two pairs of electrostatic attraction internal electrode sections 6A, 6B and 6C, 6D formed of tungsten are buried at a depth of 500 $\mu$m from a front face of the alumina dielectric body 4. These internal electrode sections define an electrastatic attraction electrode 6, and can be divided into further sections.

Figure 4:
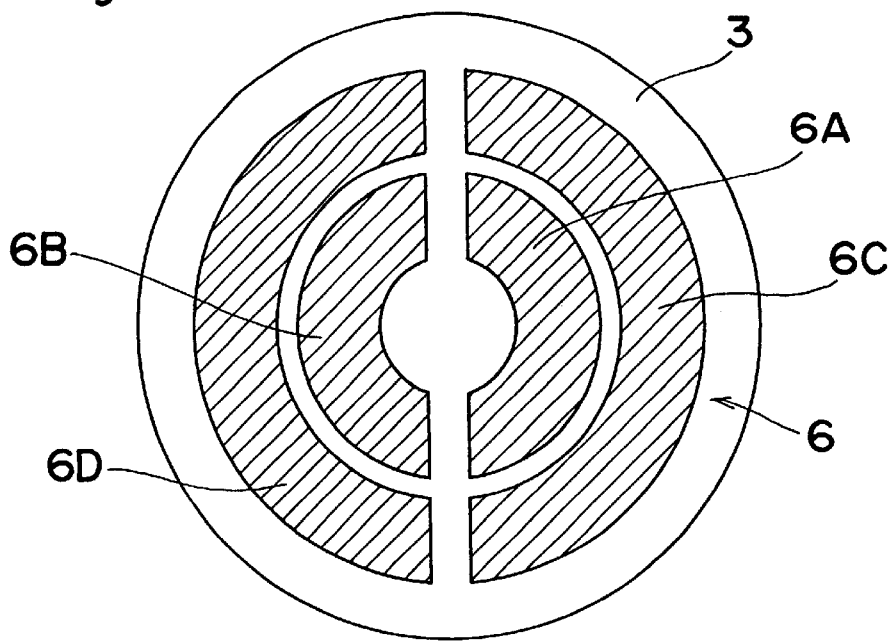
FIG. 4 is a plan view of an electrostatic attraction electrode part of the substrate hold stage in the preferred embodiment of the present invention.
Figure 5:
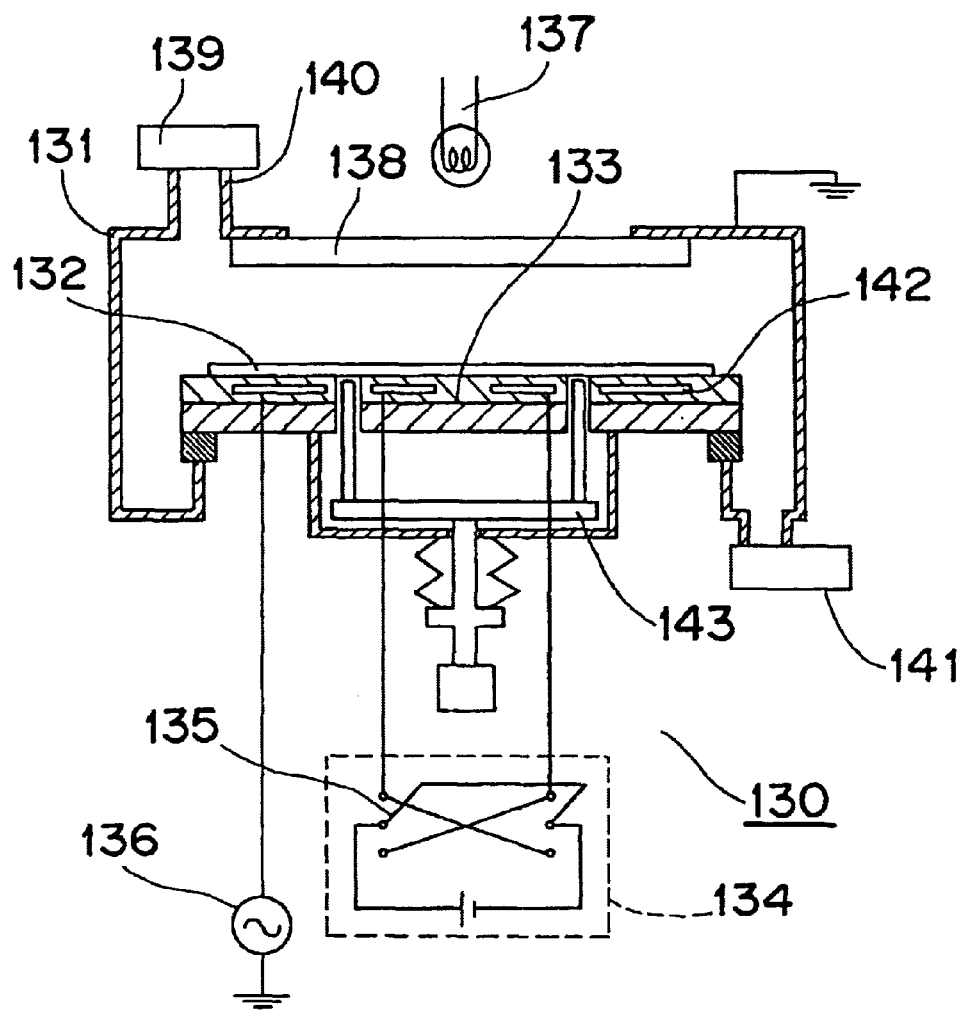
FIG. 5 is a sectional view of a reaction chamber of a conventional plasma processing apparatus.
Figure 6:
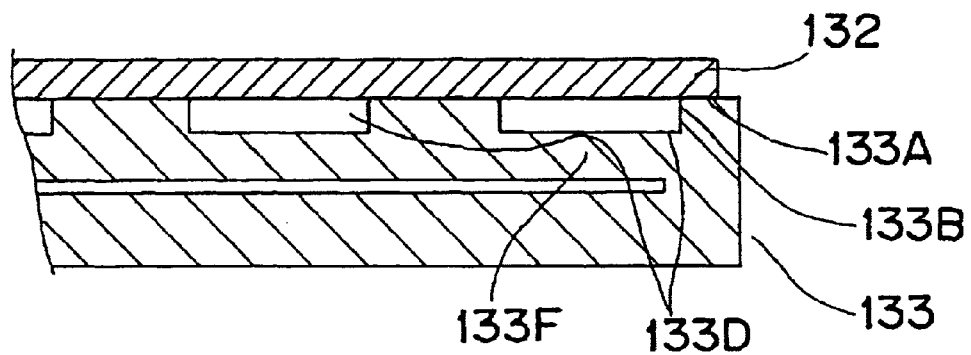
FIG. 6 is a sectional view of a substrate hold stage in the conventional plasma processing apparatus.

FIG. 4 is a plan view featuring the substrate hold stage. The substrate hold stage 3 includes the electrostatic attraction electrode 6 to which positive and negative d.c. voltages are applied by positive and negative d.c. voltage application parts. A rear face of the substrate 2 to be subjected to plasma processing is held on a set face of the alumina dielectric body 4 by applying the positive and negative d.c. voltages to the electrostatic attraction electrode 6 to generate charges by which the substrate 2 and the alumina dielectric body 4 are attracted to each other. The positive d.c. voltage application part by which the positive d.c. voltage is to be applied is divided among the at least two internal electrode sections 6A, 6C, and the negative d.c. voltage application part by which the negative d.c. voltage is to be applied is divided among the at least two electrode sections 6B, 6D, and respectively controlled individually. A first internal electrode section 6A of the sections 6A, 6C of the positive d.c. voltage application part and a first internal electrode section 6B of the sections 6B, 6D of the negative d.c. voltage application part charge a vicinity of a center of the substrate 2 and the second internal electrode section 6C of the sections 6A, 6C of the positive d.c. voltage application part and the second internal electrode section 6D of the sections 6B, 6D of the negative d.c. voltage application part charge an outer circumference of the substrate 2. Specifically, the internal electrode section 6A is for applying a positive voltage to a central part of the substrate 2, while the internal electrode section 6B is for applying a negative voltage to the central part of the substrate 2. The internal electrode section 6C is for applying a positive voltage to the substrate 2 at an outer circumferential part thereof, and the internal electrode section 6D is for applying a negative voltage to the substrate 2 at an outer circumferential part thereof.

Figure 2:
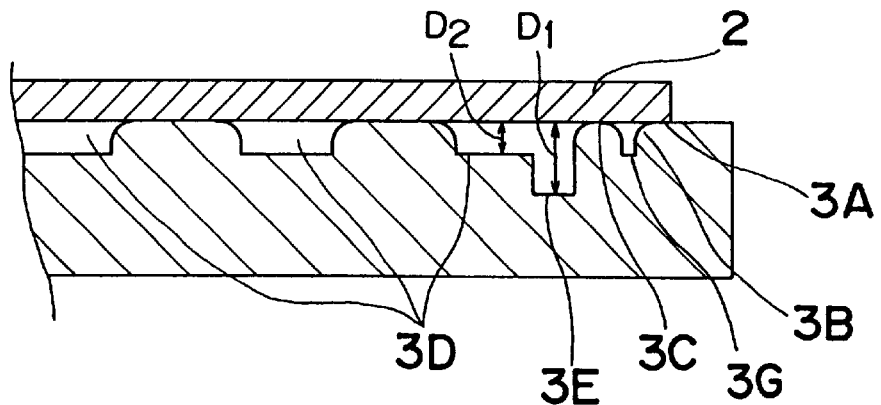
FIG. 2 is an enlarged sectional view of a part of a substrate hold stage in the preferred embodiment of the present invention.

A front face part of the alumina dielectric body 4 is shown in section in FIG. 2. Reference numeral 3A denotes a circumferential contact part at a face of the alumina dielectric body 4 that is continuous with an outer circumferential edge part of the substrate 2. Reference numeral 3C denotes a band-like or circumferential contact part arranged inwardly of the contact part 3A and concentrically arranged with respect to the contact part 3A. Each of the radially-spaced circumferential contact parts 3A, 3C is formed to have a contact face of a nearly constant breadth from the outer circumferential edge part of the substrate 2, and a sum of areas of the contact faces 3A and 3C is set to be approximately 5% of a planar area of the substrate 2. Reference numeral 3B is a curved part of a recessed part 3G of the alumina dielectric body 4 with which the substrate 2 is not brought into contact. Reference numeral 3D is a recessed part at the face of the alumina dielectric body 4 that is to be out of contact with the substrate 2, having a depth D2 of 100 $\mu$m, as one example, as shown in FIG. 2. Reference numeral 3E denotes a recessed part that is recessed further than is the recessed part 3D, and has a depth D1 of 300 $\mu$m, as one example, as shown in FIG. 2. The depth D1 is preferably from twice to ten times the depth D2.

In the other words, the set face of the alumina dielectric body 4 is provided with the recessed parts 3D, 3E of a plurality of depths, whereby 80% or more of a total area of the recessed parts, i.e. recessed part 3D, has a depth not greater than 100 $\mu$m, while 5–20% of the total area of the recessed parts, i.e. recessed part 3E, has a depth of not smaller than 100 $\mu$m. If the total area of the recessed parts having a depth of not smaller than 100 $\mu$m is less than 5%, it takes longer to fill the recessed part corresponding to this area with He gas.

Figure 3:
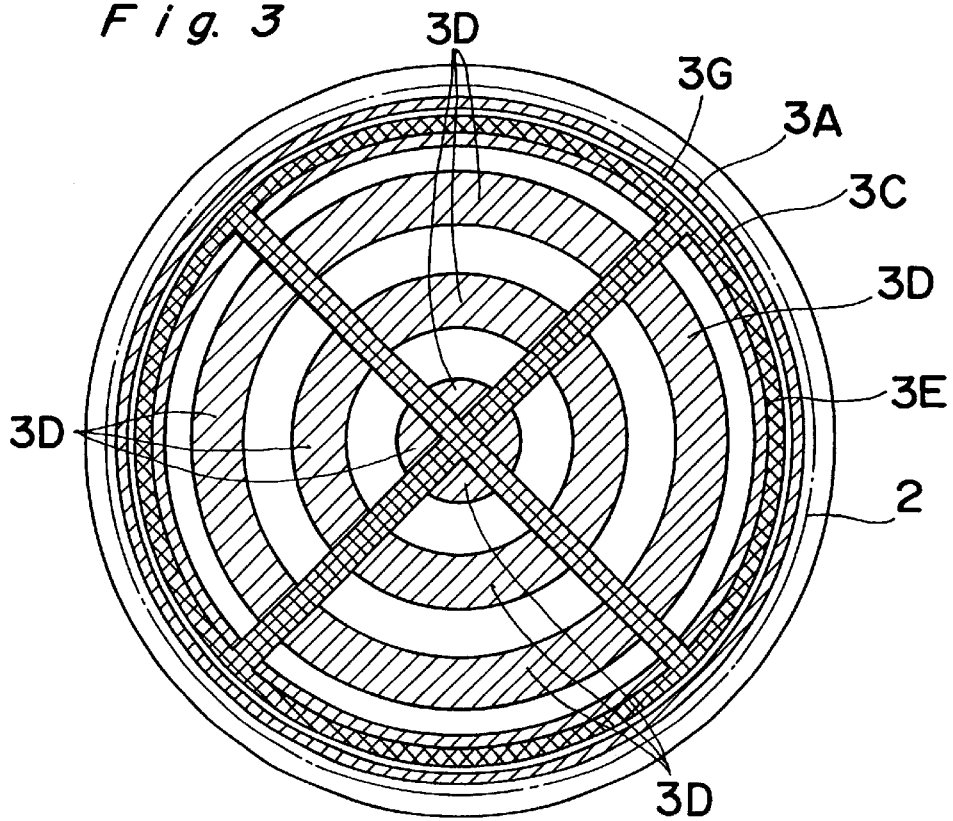
FIG. 3 is a plan view of the substrate hold stage in the preferred embodiment of the present invention.

A planar shape of the alumina dielectric body 4 is illustrated in FIG. 3. In this case, the recessed part 3E has 20% of a total area of the recessed parts 3E and 3D. Returning to FIG. 1, reference numeral 7 denotes a high frequency filter; reference numerals 8A, 9A denote d.c. power sources of a positive polarity; reference numerals 8B, 9B denote d.c. power sources of a negative polarity; reference numeral 10 denotes a capacitor; reference numeral 11 denotes a high frequency power source of 13.56 MHz; and reference numeral 12 denotes an upper grounded electrode. Reference numeral 13 denotes a heat transfer gas feed mechanism for feeding gas, e.g., He gas to a gap between the set face of the alumina dielectric body 4 and a rear face of the substrate 2, which comprises a valve and a flow rate controller. Reference numeral 14 denotes a pressure monitor and control mechanism for the heat transfer gas at the rear face of the substrate 2, and comprises a pressure gage and a throttle valve. A push mechanism 15 for the substrate 2 to be processed is set inside the substrate hold stage 3 and is to lift the substrate 2. The push mechanism 15 is sealed by a bellows from the atmosphere and is directly coupled to a direct acting motor 16 which is a driving source.

The operation of the dry etching apparatus constructed as above will be discussed with reference to FIG. 1.

The vacuum chamber 1 is evacuated and the substrate 2 to be processed is set on the alumina dielectric body 4. Positive and negative d.c. voltages are applied from the d.c. power sources 8B, 8A through the high frequency filters 7 to the pair of internal electrodes 6A, 6B at the central part of the alumina dielectric body 4, respectively. Although as one example, the maximum absolute value of the applied voltage at this time is 1.0 kV, the voltage is raised first to 200V, i.e., 20% of 1.0 kV at 5V/sec as to prevent frictional forces between the alumina dielectric body 4 and the substrate 2, which can result because of an initial warp of the substrate 2. Furthermore, positive and negative d.c. voltages are applied from the corresponding d.c. power sources 9B, 9A to the pair of internal electrodes 6C, 6D, located circumferentially outwardly of the electrodes 6A, 6B, through the high frequency filters 7. Similar to the manner of application to the central part of the substrate 2, as one example, the voltage is increased to 200V, that is 20% of 1.0 kV at 50V/sec. After the center and the outer circumferential portion of the substrate 2 are electrostatically attracted to the alumina dielectric body 4, the absolute value is increased all at once from 200V to 1.0 kV. Due to the gradual increase of the attraction force as above, the substrate 2 is attracted so that the warp of the substrate 2 is removed and the shape of the substrate 2 conforms to the set face of the alumina dielectric body 4 smoothly. The conventional disadvantage that the rear face of the substrate 2 or the alumina dielectric body 4 is rubbed can be prevented. In comparing a rise time of the d.c. voltage and arise time of a pressure between the substrate 2 and the alumina dielectric body 4 (force opposite to the attraction force) subsequent to the gas supply to the rear face of the substrate 2, the pressure rises later and therefore both can be supplied simultaneously as in the prior art, whereby a decrease in throughput can be avoided.

Changing the rise time of the d.c. voltage starting from 200V, i.e., 20% of the maximum value, is based on the finding that the rubbing between the substrate 2 and the alumina dielectric body 4 can be lessened in a range of the voltage being not higher than 200V from a correlation of a size of the substrate 2 and the attraction force by the d.c. voltage. A waste of time can be eliminated as the voltage is increased stepwise as shown in FIG. 7.

Figure 7:
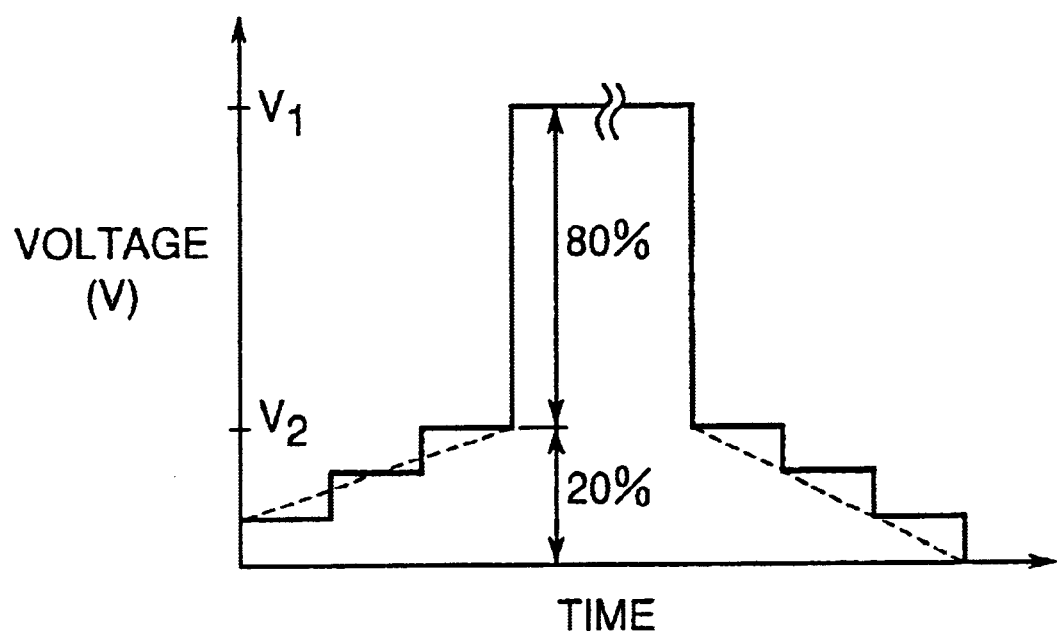
FIG. 7 is a graph showing voltage application and stoppage of application of voltage in the plasma processing apparatus according to the preferred embodiment.
Figure 8:
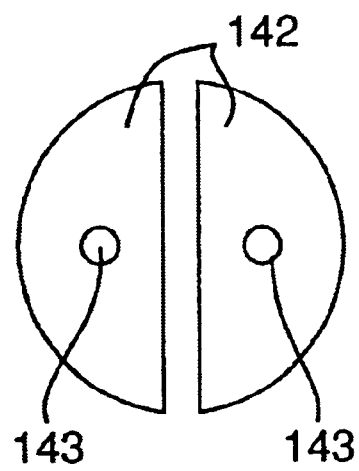
FIG. 8 is a plan view of internal electrodes of the conventional plasma processing apparatus.

FIG. 7 shows an example of the voltage application and stoppage of the application. That is, in applying the d.c. voltage, the application of the d.c. voltage is carried out stepwise at the absolute value of 100V/sec or lower before reaching the value $V_2$ which is 20% of the maximum application value $V_1$, and is then carried out at a value higher than the absolute value of 100V/sec thereafter. In removing the substrate 2, the d.c. voltage is decreased at a value higher than the absolute value 100V/sec before reaching the value $V_2$ which is 20% of the maximum application value $V_1$, and is then carried out at the absolute value 100V/sec or lower to stop the application for removing the substrate 2. At this time, the application and the stoppage of the application can be carried out gradually instead of stepwise, as shown by dotted lines in FIG. 7. The reason why the application before reaching the value $V_2$, and the voltage decrease after reaching the value $V_2$, is carried out at the absolute value 100V/sec or lower is that if those operations are carried out at a value higher than 100V/sec, dust is generated and the above effects cannot be obtained.

Since the alumina dielectric body 4 is so constituted as to set 15% of an area of the substrate 2 thereon, a heat conduction efficiency achieving an optimum temperature for plasma processing is obtained. Moreover, since the contact area is reduced as much as possible, a residual attraction which will be described later is lessened. In addition, for solving the issue that a frictional resistance increases when the substrate 2 is attracted, the curved part 3B of the alumina dielectric body 4 is formed by surface polishing with a soft material such as a buff or the like, thereby forming a gentle curve of a radius of curvature of approximately 10 $\mu$m. Optimizing the contact area between the substrate 2 and the alumina dielectric body 4, optimizing the application method for the d.c. voltage, and decreasing the frictional resistance at the attraction time make it possible to control the temperature of the substrate 2 during its processing and reduce dust.

A set area of the alumina dielectric body 4 is set to be 15% of the planar area of the substrate 2. According to experiments, if this set area ratio is larger than 15%, a charge elimination effect by the He gas is weakened due to a small contact area with the He gas at the rear face of the substrate 2, which readily leads to the residual attraction, and if the set area ratio is smaller than 5%, the substrate 2 is deformed when the substrate 2 is attracted, and thus optimum processing is impeded. The phenomenon might take place particularly when a substrate such as a liquid crystal substrate or the like to be processed becomes large in size. Meanwhile, the curved part 3B is formed to make a smooth curve with its radius of curvature being approximately 10 $\mu$m, because it is confirmed that the static frictional resistance between the substrate 2 and the alumina dielectric body 4 increases, such that the substrate 2 or the alumina dielectric body 4 becomes easily rubbed when the substrate 2 is attracted to the alumina dielectric body 4, if the radius of curvature is smaller than 5 $\mu$m.

The curved part 3B is preferably shaped mechanically. Chemical processing or processing through a physical reaction tends to produce a chemically or physically weak part locally, while leaving edges or the like; thus making it difficult to solve the above problems. Mechanical processing shaves the part to remove projections, and therefore facilitates formation of the curved part into the smooth curve.

At a next step of the operation, the He gas is introduced by the He gas feed mechanism 13 at 10 cc/min, as one example, to the rear face of the substrate 2, which is regulated to 1400 Pa, as one example, by the pressure control mechanism 14. In this case, the recessed part 3E of the electrostatic attraction electrode has 20% of a total area of the recessed parts (combined area of the recessed parts 3D, 3E) and also is nearly uniformly disposed along the entire face, so that the pressure by the He gas between the substrate 2 and the alumina dielectric body 4 increases almost simultaneously and uniformly over the entire area. Accordingly, the substrate 2 is prevented from being warped because of a partial pressure difference inherent in the prior art, and the rubbing between the substrate 2 and the alumina dielectric body 4 is eliminated. With the primary objective being achieved, that is, while the substrate 2 is controlled to be at an optimum temperature and the residual attraction is restricted, the He gas at the rear face is sealed with higher efficiency due to a labyrinth structure of double contact faces 3A, 3C at the outer circumferential part of the substrate 2, and a jetting-out of dust as a result of leakage of the He gas is prevented. An O ring or a similar seal is not used for sealing the He gas, and therefore the substrate hold stage 3 is made simple according to the present embodiment.

Although the contact parts 3A, 3C in total are formed to occupy approximately 5% of the planar area of the substrate 2, if this ratio is larger than 10%, the outer circumferential edge part of the substrate 2 which contacts the He gas at the rear face thereof is lessened, and the ability to control the temperature or uniformly etch the substrate is worsened. The etching cannot be conducted in a predetermined manner.

The recessed part 3D has a depth of 100 μm in the embodiment, as one example. Experiments show that the electrostatic attraction force decreases as a whole when this depth is larger than 100 μm, and becomes hard to control by a simple increase/decrease of the contact area between the substrate 2 and the alumina dielectric body 4. Besides, a difference between a temperature of water flowing in the cooling water passage of the alumina base part 5 and the temperature of the substrate 2 increases. In other words, temperature controllability is deteriorated. The recessed part 3E is deeper and less in area than is the recessed part 3D. Specifically, 80% of a total area of the recessed parts, 3D plus 3E, is at the depth of 100 μm and 20% of the total area of the recessed parts, 3D plus 3E, is at the depth of 300 μm. If the 300 μm-deep area is larger than 20%, the total electrostatic attraction force decreases and is hard to control through a mere increase/decrease of the contact area between the substrate 2 and the alumina dielectric body 4.

Next, as one example, $CF_4$ and $O_2$ are simultaneously introduced as a reaction gas from the gas introduction opening 30 at 30 cc/min and 5 cc/min, respectively, and regulated to be 20 Pa. A high frequency power from the high frequency power source 11 is divided in two, from which a d.c. voltage is removed at the capacitor 10. The high frequency power passing through the capacitor 10 is supplied to one pair of the internal electrode sections, whereby plasma is generated. Desired etching is carried out while the substrate 2 to be processed is efficiently cooled by the supply of He gas to its rear face. The supply of each of the high frequency power, the reaction gas, and the He gas is stopped after the etching is completed. The chamber 1 is evacuated by the discharge system 31, and the d.c. power sources 8A, 8B, 9A, 9B are stopped from outputting. Although the substrate 2 is etched as desired in the above manner, the substrate 2 is still attracted by electrification from the plasma and residual charges present between the set face of the alumina dielectric body 4 and the rear face of the substrate 2. In this state, if the substrate 2 is forcibly separated and transferred from the alumina dielectric body 4 by the push mechanism 15, a transfer problem results or the substrate 2 is broken. Even the residual attraction of a level not causing the transfer problem or breakage of the substrate 2 causes rubbed dust generated at the rear face of the substrate 2 to be moved, or results in the electrostatic attraction electrode 6, in attracting the substrate 2 to the set face of the alumina dielectric body 4, causing the substrate 2 to slightly oscillate when the substrate 2 is separated from the alumina dielectric body 4 by the push mechanism 15, which results in a yield decrease. The embodiment copes with these inconveniences by stopping the d.c. power sources 8A, 8B, 9A, 9B, whereby electrostatic attraction is also stopped. More specifically, as one example, the pair of internal electrodes 6C, 6D located at the outer circumferential part of the alumina dielectric body 4 is lowered from the absolute value 1.0 kV to 200V, and further lowered from 200V to 0V at 50V/sec. Thereafter, the pair of internal electrodes 6A, 6B at the central part of the alumina dielectric body 4 is decreased from the absolute value 1.0 kV to 200V, and then from 200V to 0V at 50V/sec. The residual charges are lessened by decreasing a quantity of electric charges stepwise as above, so that the residual attraction is avoided. Although the residual attraction of approximately 500 Pa (3.8 gf/cm$^2$) sometimes results in the prior art example, the attraction force is reduced to 100 Pa (0.8 gf/cm$^2$) or lower at all times, in one example of the embodiment. According to the present embodiment, therefore, not only the transfer problem and breakage of the substrate 2 can be prevented, but the residual attraction of a minute amount is eliminated, thereby preventing dust from contacting the front face of the substrate 2.

The reason for changing a drop time of the d.c. voltage at 20% of the maximum value, namely 200V, is the same as that in the case of the rise time.

A charge elimination plasma process is not employed in the present embodiment, and neither is a corona discharge high-voltage electrode or the like set in the vacuum chamber 1. Therefore, generation of dust by micro sputtering from the vacuum chamber 1, contamination with impurities, and generation of dust from electrode materials are prevented. Damage of the device (for instance, shift of a threshold voltage of a MOS transistor, etc.) is never realized.

As described hereinabove, in the present embodiment, generation of dust at the time of electrostatic attraction is suppressed and jetting-out of dust due to leak of the He gas inside the chamber is eliminated. At the same time, the residual attraction between the substrate 2 to be processed and the set face of the alumina dielectric body 4, as a result of the electrostatic attraction and the plasma processing, can be reduced to a level whereat the above transfer problem and the dust problem are avoided.

The apparatus of the foregoing embodiment includes: (1) a way of increasing and decreasing the d.c. voltage; (2) a way of controlling application positions of the d.c. voltage; (3) a set area of the substrate hold stage for the substrate; (4) a shaped end part of the contact face; (5) a structure of the set face where the outer circumferential edge part of the substrate is placed; and (6) specific shapes of the recessed parts of the set face. However, it is confirmed that a sufficient effect is achieved even with the use of the above features (1)–(6) singly although the features are naturally preferably existing concurrently.

The application of the d.c. voltage and the stoppage of the application is described, as one example in the embodiment, in order to attract the substrate 2 as applying the d.c. voltage at the absolute value 100V/sec or lower before reaching not larger than 20% of the maximum application value and then applying the d.c. voltage at a value higher than the absolute value 100V/sec thereafter, and in order to remove the substrate 2 the applied d.c. voltage is decreased at a value higher than the absolute value 100V/sec before reaching not larger than 20% of the maximum application value, and then the d.c. voltage is applied at the absolute value 100V/sec or lower to stop the application thereof.

The recessed parts of the alumina dielectric body 4 are not limited to be concentric as in the present example. However, an arrangement whereby the alumina dielectric body 4 is held in uniform contact with the substrate 2 is preferred in terms of temperature control.

Furthermore, the internal electrode sections 6A, 6B, 6C and 6D to which the d.c. voltages are applied are disposed concentrically in the embodiment, but are not limited to this disposition. The positive and negative electrode sections preferably have an equal area from a view point of temperature control and are preferably placed in an area as small as possible, e.g., like a comb to attract the substrate 2 uniformly.

Instead of the He gas used in the embodiment to be supplied to the rear face of the substrate 2, an inert gas or a different gas may be used.

A piping system for the He gas to the rear face of the substrate 2 is not limited to the one described in the embodiment. Any piping system that can supply the gas to the rear face of the substrate 2 is utilizable.

The substrate hold stage 3 of the embodiment is provided with the electrostatic attraction electrode 6 having internal electrode sections in pairs, in other words, a so-called bipolar type. The same effect can be obtained by adopting as the electrostatic attraction electrode of the present embodiment an electrostatic attraction electrode of a unipolar type.

The substrate hold stage 3 is an electrostatic attraction type in the embodiment. Since the transfer problem by the residual attraction is possibly brought about particularly when the substrate 2 is formed of an insulating material, even if the substrate hold stage 3 having a front face defined by the alumina dielectric body 4 is grounded or a high frequency power is applied thereto, the present invention remains effective.

Although the dry etching apparatus of a reactive ion etching type is employed in the present embodiment, a method for generating plasma is not restricted to this type. For example, an induction coupling type, an ECR type, a helicon wave type, a surface wave type, etc. can be used.

The dry etching apparatus is depicted by way of example in the embodiment. The present invention is applicable to a plasma CVD apparatus, a sputtering apparatus, and an ashing apparatus.

Accordingly to the present invention as described herein, generating of dust when the substrate to be processed is electrostatically attracted to the substrate hold stage is reduced. Also solved is the problem of residual attraction when the electrostatic attraction is stopped. Product failures due to the transfer problem, generation of dust, and device damage are eliminated accordingly.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A plasma processing apparatus comprising:
   a vacuum chamber for evacuating gas therefrom, for introducing reaction gas therein, and for generating plasma therein through high frequency power application; and
   a substrate hold stage within said vacuum chamber, with said substrate hold stage including a set face on which is to be held a substrate that is to be subjected to plasma processing, wherein said set face has an outer edge and a recessed portion such that when the substrate is held on said set face not less than 5% and not greater than 15% of a planar area of the substrate is in contact with said set face, said recessed portion comprising plural recesses that define a surface area such that the recesses corresponding to at least 80% of said surface area have a depth of not more than 100 $\mu$m and a recesses corresponding to from 5% to 20% of said surface area has a depth of greater than 100 $\mu$m and is located nearer to said outer edge of said set face than are said recesses having a death of not more than 100 $\mu$m.

2. The plasma processing apparatus according to claim 1, wherein said set face further has radially-spaced circumferential portions such that when the substrate is held on said set face not more than 10% of a planar area of the substrate is in contact with said radially-spaced circumferential portions, and
   wherein said recessed portion defines a semi-circular smooth curved edge portion that is to contact the substrate when the substrate is held on said set face, with said semi-circular smooth curved edge portion having a radius of curvature of not less than 5 $\mu$m and being formed by performing a mechanical shaping operation on a member that is to constitute said substrate hold stage.

3. The plasma processing apparatus according to claim 2, wherein said set face has said radially-spaced circumferential portions such that when the substrate is held on said set face approximately 5% of the planar area of the substrate is in contact with said radially-spaced circumferential portions,
   wherein said recessed portion comprises said plural recesses that define a surface area such that said recesses corresponding to at least 80% of said surface area have a depth of approximately 100 $\mu$m and said recesses corresponding to from 5% to 20% of said surface area have a depth of approximately 300 $\mu$m, and
   wherein said recessed portion defines said semi-circular smooth curved edge portion that is to contact the substrate when the substrate is held on said set face such that said semi-circular smooth curved edge portion has a radius of curvature of approximately 10 $\mu$m.

4. The plasma processing apparatus according to claim 3, wherein said substrate hold stage includes an electrostatic attraction electrode to which positive and negative d.c. voltages are to be stepwise applied from a positive d.c. voltage application part and a negative d.c. voltage application part, respectively, such that when the substrate is to be held on said substrate hold stage positive and negative d.c. voltages are stepwise applied from the positive and negative d.c. voltage application parts, respectively, to said electrostatic attraction electrode whereby charges are generated by which the substrate and said substrate hold stage become attracted to each other.

5. The plasma processing apparatus according to claim 4, wherein said apparatus comprises a dry etching apparatus for performing dry etching of the substrate in said vacuum chamber.

6. The plasma processing apparatus according to claim 1, wherein said apparatus comprises a dry etching apparatus for performing dry etching of the substrate in said vacuum chamber.

7. The plasma processing apparatus according to claim 1, wherein said set face further has radially-spaced circumferential portions such that when the substrate is held on said set face not more than 10% of a planar area of the substrate is in contact with said radially-spaced circumferential portions.

8. A plasma processing apparatus comprising:
   a vacuum chamber for evacuating gas therefrom, for introducing reaction gas therein, and for generating plasma therein through high frequency power application; and
   a substrate hold stage within said vacuum chamber, with said substrate hold stage including a set face on which is to be held a substrate that is to be subjected to plasma processing, wherein said set face has an outer edge and recessed portions defining a surface area such that the recessed portions corresponding to at least 80% of said surface area have a depth of not greater than 100 µm and a recessed portions corresponding to from 5% to 20% of said surface area has a depth of greater than 100 µm and is located nearer to said outer edge of said set face than are said recesses having a depth of not more 100 µm, wherein said recessed portions corresponding to at least 80% of said surface area have a depth of approximately 100 µm and said recessed portions corresponding to from 5% to 20% of said surface area has a depth of approximately 300 µm.

9. The plasma processing apparatus according to claim 8, wherein said substrate hold stage includes an electrostatic attraction electrode to which positive and negative d.c. voltages are to be stepwise applied from a positive d.c. voltage application part and a negative d.c. voltage application part, respectively, such that when the substrate is to be held on said substrate hold stage positive and negative d.c. voltages are stepwise applied from the positive and negative d.c. voltage application parts, respectively, to said electrostatic attraction electrode whereby charges are generated by which the substrate and said substrate hold stage become attracted to each other.

10. The plasma processing apparatus according to claim 8, wherein said apparatus comprises a dry etching apparatus for performing dry etching of the substrate in said vacuum chamber.

* * * * *

UNITED STATES PATENT AND TRADEMARK OFFICE
CERTIFICATE OF CORRECTION

PATENT NO. : 6,648,976 B1
DATED : November 18, 2003
INVENTOR(S) : Izuru Matsuda et al.

It is certified that error appears in the above-identified patent and that said Letters Patent is hereby corrected as shown below:

Column 13,
Line 63, please replace "and a recesses" with -- and a recess --.
Line 67, please replace "having a death" with -- having a depth --.

Column 15,
Lines 4 and 11, please replace "recessed portions corresponding" with -- recessed portion corresponding --.

Signed and Sealed this

Thirteenth Day of April, 2004

JON W. DUDAS
*Acting Director of the United States Patent and Trademark Office*

UNITED STATES PATENT AND TRADEMARK OFFICE
CERTIFICATE OF CORRECTION

PATENT NO.     : 6,648,976 B1 Page 1 of 1
DATED          : November 18, 2003
INVENTOR(S)    : Izuru Matsuda et al.

It is certified that error appears in the above-identified patent and that said Letters Patent is hereby corrected as shown below:

<u>Column 13,</u>
Line 62, please replace "and a recesses" with -- and a recess --.
Line 66, please replace "having a death" with -- having a depth --.

<u>Column 15,</u>
Lines 4 and 11, please replace "recessed portions corresponding" with -- recessed portion corresponding --.

This certificate supersedes Certificate of Correction issued April 13, 2004.

Signed and Sealed this

Twenty-eighth Day of September, 2004

JON W. DUDAS
*Director of the United States Patent and Trademark Office*